United States Patent
Tanaka et al.

(10) Patent No.: US 7,033,680 B2
(45) Date of Patent: Apr. 25, 2006

(54) ELECTROLUMINESCENT ELEMENT

(75) Inventors: Masato Tanaka, Machida (JP); Yoshikazu Makioka, Tsukuba (JP); Toshihiro Ohnishi, Nakano (JP); Tomoyuki Suzuki, Tsukuba (JP); Shuji Doi, Tsukuba (JP)

(73) Assignees: Sumitomo Chemical Company, Limited, Osaka (JP); National Institute of Advanced Industrial Science and Technology, Tokyo (JP)

( * ) Notice: Subject to any disclaimer, the term of this patent is extended or adjusted under 35 U.S.C. 154(b) by 4 days.

(21) Appl. No.: 10/497,097

(22) PCT Filed: Nov. 27, 2002

(86) PCT No.: PCT/JP02/12394

§ 371 (c)(1),
(2), (4) Date: May 28, 2004

(87) PCT Pub. No.: WO03/046108

PCT Pub. Date: Jun. 5, 2003

(65) Prior Publication Data

US 2005/0106413 A1 May 19, 2005

(30) Foreign Application Priority Data

Nov. 30, 2001 (JP) .............................. 2001/366242
Apr. 5, 2002 (JP) .............................. 2002/103484

(51) Int. Cl.
*H05B 33/14* (2006.01)
*C09K 11/06* (2006.01)
*C08G 79/04* (2006.01)

(52) U.S. Cl. ..................... 428/690; 428/917; 313/504; 313/506; 257/40; 257/103; 528/394; 528/398; 528/442; 252/301.35

(58) Field of Classification Search ................ 428/690, 428/917, 332; 313/504, 506; 257/40, 103; 528/394, 398, 422; 252/301.35
See application file for complete search history.

(56) References Cited

FOREIGN PATENT DOCUMENTS

| | | |
|---|---|---|
| EP | 1 378 532 A1 | 1/2004 |
| JP | 2000-252065 A | 9/2000 |
| WO | WO 02/072661 A1 | 9/2002 |

OTHER PUBLICATIONS

Y. Makioka et al., "Phosphafluorene-Based π-Conjugated Polymers", *Proceedings of the 79th Annual Spring Meeting of The Chemical Societyt of Japan*, 3D209, 2001, p. 281, with partial English translation.

*Primary Examiner*—Dawn Garrett
(74) *Attorney, Agent, or Firm*—Sughrue Mion, PLLC

(57) ABSTRACT

An electroluminescent device comprising electrodes consisting of a pair of an anode and a cathode, at least one of the electrodes being either transparent or translucent, and an organic layer interposed between said electrodes, wherein said organic layer comprises a copolymer comprising in the main chain thereof 9-oxo-9-phosphafluorene-2,7-diyl units and arylene units, represented by formula (1) below, and the thickness of said organic layer is from 1 nm to 10 μm:

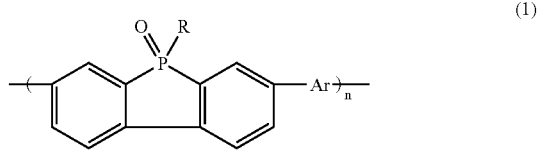

(1)

wherein R represents hydrogen, alkyl, cycloalkyl, aralkyl, aryl, alkyloxy, cycloalkyloxy, aralkyloxy, or aryloxy; Ar represents arylene; and n is an integer of 3 to 30,000.

21 Claims, No Drawings

ELECTROLUMINESCENT ELEMENT

TECHNICAL FIELD

The present invention relates to an electroluminescent device (hereinafter sometimes referred to as an EL device) comprising a copolymer comprising 9-oxo-9-phosphafluorene-2,7-diyl units in the main chain thereof.

BACKGROUND ART

High molecular weight light emitting materials and charge transport materials are, in contrast to the corresponding low molecular weight materials, soluble in solvents and hence, with the aid of coating methods, can form light emitting layers and charge transport layers in light emitting devices. Therefore, various investigations have been carried out on these high molecular weight materials. As polymer materials which can be used as light emitting materials and charge transport materials for EL devices, polyphenylene vinylene derivatives, polyfluorene derivatives, polyphenylene derivatives and the like have hitherto been known. On the other hand, a copolymer is well known in the art which comprises 9-oxo-9-phosphafluorene-2,7-diyl units and arylene units in the main chain thereof (Proceedings of the 79th Annual Spring Meeting of the Chemical Society of Japan, 2001, 3D209, p. 821); however an EL device has not been known yet which uses a copolymer comprising 9-oxo-9-phosphafluorene-2,7-diyl units as the main chain thereof.

DISCLOSURE OF THE INVENTION

An object of the present invention is to provide a novel EL device using a copolymer which has as the main chain thereof 9-oxo-9-phosphafluorene-2,7-diyl units.

More specifically, the present invention relates to:

[1] An EL device comprising electrodes consisting of a pair of an anode and a cathode, at least one of the electrodes being either transparent or translucent, and an organic layer interposed between the above described electrodes, wherein the above described organic layer comprises a copolymer containing in the main chain thereof 9-oxo-9-phosphafluorene-2,7-diyl units and arylene units, represented by formula (1) below, and the thickness of the above described organic layer is from 1 nm to 10 μm (hereinafter, the organic layer may be referred to as the layer comprising the copolymer represented by formula (1)); a flat light source, a segment display, and a dot matrix display, all using the above EL device; and a liquid crystal display using the EL device as the back light:

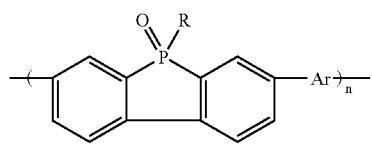
(1)

wherein R represents hydrogen, alkyl, cycloalkyl, aralkyl, aryl, alkyloxy, cycloalkyloxy, aralkyloxy, or aryloxy; Ar represents arylene; n is an integer of 3 to 30,000.

[2] An EL device comprising electrodes consisting of a pair of an anode and a cathode, at least one of the electrodes being either transparent or translucent, and an organic layer interposed between the above described electrodes, wherein the above described organic layer comprises a copolymer having a number average molecular weight of $10^3$ to $10^8$ in terms of polystyrene and having in the main chain thereof repeating units represented by the following formulas (2) and (3), respectively; a flat light source, a segment display, or a dot matrix display, all using the above EL device; and a liquid crystal display using the EL device as the back light:

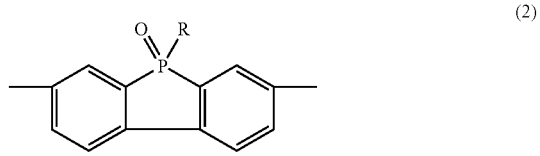
(2)

wherein R represents hydrogen, alkyl, cycloalkyl, aralkyl, aryl, alkyloxy, cycloalkyloxy, aralkyloxy, or aryloxy; and

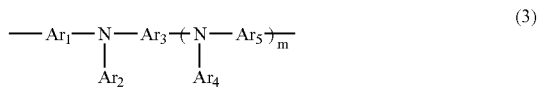
(3)

wherein $Ar_1$, $Ar_3$ and $Ar_5$ are each independently arylene or a divalent heterocyclic group; $Ar_2$ and $Ar_4$ are each independently aryl or a monovalent heterocyclic group; and m is an integer of 0 to 3.

[3] A copolymer comprising in the main chain thereof the repeating units represented by the above formulas (2) and (3) and having a number average molecular weight of $10^3$ to $10^8$ in terms of polystyrene.

BEST MODE FOR CARRYING OUT THE INVENTION

In the general formula (1), Ar represents a substituted or unsubstituted arylene. Examples of the arylene include, for example, an arylene group containing 6 to 20 carbon atoms; specific examples of the unsubstituted arylene include 1,4-phenylene, 1,4-naphthalene-diyl, 2,6-naphthalene-diyl, 9,10-anthracene-diyl, 1,4-anthracene-diyl, and 4,4-biphenylene; the substituents of the arylene can be selected, independently of R in the above described general formula (1), from the group consisting of alkyl, cycloalkyl, aralkyl, aryl, alkyloxy, cycloalkyloxy, aralkyloxy, and aryloxy, these being all cited for R in the general formula (1), and the specific examples of the substituents can be also selected from the R groups which are described below. Specific examples of the substituted arylene groups include 2-methyl-1,4-phenylene, 2,5-dimethyl-1,4-phenylene, 2,3-dimethyl-1,4-phenylene, 2,3,4,5,6-tetramethyl-1,4-phenylene, 2,5-dimethoxy-1,4-phenylene, and 2,5-bis(1-methylheptyloxy)-1,4-phenylene.

Here, R in the general formula (1) represents hydrogen, alkyl, cycloalkyl, aryl, aralkyl, alkyloxy, cycloalkyloxy, aralkyloxy, or aryloxy.

When R in the general formula (1) is alkyl, examples of the alkyl group include straight or branched alkyl groups having from 1 to 20 carbon atoms, preferably from 1 to 15 carbon atoms; specific examples thereof include methyl, ethyl, n- and iso-propyl, n-iso-, sec- and tert-butyl, n-, iso-, sec-, tert- and neo-pentyl, and n-hexyl, n-heptyl, n-octyl, 1-methylheptyl, and n-nonyl.

When R in the general formula (1) is cycloalkyl, examples of the cycloalkyl include cycloalkyl groups having from 5 to 18 carbon atoms, preferably from 5 to 10 carbon atoms; specific examples thereof include cyclopentyl, cyclohexyl, cyclooctyl and cyclododecyl.

When R in the general formula (1) is aralkyl, examples of the aralkyl include aralkyl groups having from 7 to 13 carbon atoms, preferably from 7 to 11 carbon atoms; specific examples thereof include benzyl, phetyl and naphthylmethyl.

When R in the general formula (1) is aryl, examples of the aryl include aryl groups having from 6 to 18 carbon atoms, preferably from 6 to 14 carbon atoms; specific examples thereof include phenyl and naphthyl, and substituted derivatives thereof, namely, tolyl and xylyl.

When R in the general formula (1) is aralkyl, examples of the aralkyl include aralkyl groups having from 7 to 20 carbon atoms, preferably from 7 to 15 carbon atoms; specific examples thereof include methylphenyl, ethylphenyl and methylnaphthyl.

When R in the general formula (1) is alkyloxy, examples of the alkyloxy include alkyloxy groups having from 1 to 20 carbon atoms, preferably from 1 to 15 carbon atoms; specific examples thereof include methoxy, ethoxy, n- and isopropoxy, n-, iso-, sec-, and tert-butoxy, n-, iso-, sec-, tert- and neo-pentyloxy, and n-hexyloxy, n-heptyloxy, n-octyloxy and 1-methylheptyloxy.

When R in the general formula (1) is cycloalkyloxy, examples of the cycloalkyloxy include cycloalkyloxy groups having from 5 to 18 carbon atoms, preferably from 5 to 10 carbon atoms; specific examples thereof include cyclopentyloxy, cyclohexyloxy, cyclooctyloxy, and cyclododecyloxy.

When R in the general formula (1) is aralkyloxy, examples of the aralkyloxy include aralkyloxy groups having from 7 to 13 carbon atoms, preferably from 7 to 11 carbon atoms; specific examples thereof include benzyloxy, phenetyloxy and naphthylmethoxy.

When R in the general formula (1) is aryloxy, examples of the aryloxy include aryloxy groups having from 6 to 18 carbon atoms, preferably from 6 to 14 carbon atoms; specific examples thereof include phenoxy, and 1- and 2-naphthyloxy, and substituted derivatives thereof, namely, tolyloxy and anisyloxy.

Incidentally, the copolymers to be used in the present invention may comprise repeating units other than the repeating units shown in the general formula (1).

The polymerization degree (n) of the copolymer to be used in the present invention, represented by the general formula (1), is preferably 3 to 30,000, more preferably 10 to 10,000. The number average molecular weight of the copolymer represented by the general formula (1), measured by gel permeation chromatography with polystyrene as standard, is usually of the order of $10^3$ to $10^8$, preferably $10^3$ to $10^7$, more preferably $2 \times 10^3$ to $10^6$.

Examples of the good solvent for the copolymer to be used in the present invention, represented by the general formula (1), include chlorine based solvents such as chloroform, methylene chloride and dichloroethane. Usually, the above described copolymer can be dissolved in these solvents in a concentration of 0.1 wt % or more, although depending on the structure and molecular weight of the copolymer.

Now, a description will be made below of the copolymer comprising in the main chain thereof the repeating units represented by formulas (2) and (3).

In the general formula (2), R is defined in the same manner as that in the general formula (1).

In the above described formula (3), $Ar_1$, $Ar_3$ and $Ar_5$ are each independently arylene or a divalent heterocyclic group; $Ar_2$ and $Ar_4$ are each independently aryl or a monovalent heterocyclic group; and m is an integer of 0 to 3. When m is 2 or more, plural $Ar_4$ and $Ar_5$ may be either the same or different from each other.

Here, the arylene group is defined in the same manner as Ar in the general formula (1).

The divalent heterocyclic group is the atomic group made of a heterocyclic compound deprived of 2 hydrogen atoms, wherein the number of the carbon atoms is 4 to 60. Examples of the divalent heterocyclic group include furan-diyl, thienylene, fluorene-diyl, pyridine-diyl, quinoline-diyl and quinoxaline-diyl. The divalent heterocyclic group can have substituents, but the above-described number of the carbon atoms in the divalent heterocyclic group does not include the number of the carbon atoms in the substituents.

The aryl group is defined similarly to the above description.

The monovalent heterocyclic group is the atomic group made of a heterocyclic compound deprived of 1 hydrogen atom, wherein the number of the carbon atoms is usually of the order of 4 to 60. Specific examples of the monovalent heterocyclic group include thienyl, ($C_1$–$C_{12}$alkyl)thienyl, pyrolyl, furyl, pyridyl and ($C_1$–$C_{12}$alkyl)pyridyl; among these preferable are thienyl, ($C_1$–$C_{12}$alkyl)thienyl, pyridyl and ($C_1$–$C_{12}$alkyl)pyridyl.

Incidentally, a hetrocyclic compound is an organic compound having a ring structure that has, within the ring, a hetero atom(s) such as oxygen, sulfur, nitrogen, phosphorus, boron and the like, in addition to carbon atoms as those constituting the ring.

In the repeating units represented by the above formula (3), $Ar_1$, $Ar_2$, $Ar_3$, $Ar_4$ and $Ar_5$ may have substituents such as alkyl, cycloalkyl, alkyloxy, alkylthio, alkylsilyl, alkylamino, aryl, aryloxy, arylsilyl, arylamino, aralkyl, aralkyloxy, arylalkylsilyl, arylalkylamino, arylalkenyl, arylalkynyl, phenylethenyl, alkylphenylethenyl and alkoxyphenylethenyl.

The above described alkyl, cycloalkyl, alkyloxy, aryl, aryloxy, aralkyl and aralkyloxy are defined similarly to the above description.

The above described alkylthio group may be straight, branched or cyclic, wherein the number of the carbon atoms is usually of the order of 1 to 20. Specific examples of the alkylthio group include methylthio, ethylthio, propylthio, i-propylthio, butylthio, i-butylthio, t-butylthio, pentylthio, isoamylthio, hexylthio, cyclohexylthio, heptylthio, octylthio, 2-ethylhexylthio, nonylthio, decylthio, 3,7-dimethyloctylthio and laurylthio; among these preferable are pentylthio, isoamylthio, hexylthio, octylthio, 2-ethylhexylthio, decylthio and 3,7-dimethyloctylthio.

The above described alkylsilyl group may be straight, branched or cyclic, wherein the number of the carbon atoms is usually of the order of 1 to 60. Specific examples of the alkylsilyl group include methylsilyl, ethylsilyl, propylsilyli i-propylsilyl, butylsilyl, i-butylsilyl, t-butylsilyl, pentylsilyl, isoamylsilyl, hexylsilyl, cyclohexylsilyl, heptylsilyl, octylsilyl, 2-ethylhexylsilyl, nonylsilyl, decylsilyl, 3,7-dimethyloctylsilyl, laurylsilyl, trimethylsilyl, ethyldimethylsilyl, propyldimethylsilyl, i-propyldimethylsilyl, butyldimethylsilyl, t-butyldimethylsilyl, pentyldimethylsilyl, isoamyldimethylsilyl, hexyldimethylsilyl, heptyldimethylsilyl, octyldimethylsilyl, 2-ethylhexyldimethylsilyl, nonyldimethylsilyl, decyldimethylsilyl, 3,7-dimethyloctyl-dimethylsilyl and lauryldimethylsilyl; among these preferable are pentylsilyl, isoamylsilyl, hexylsilyl, octylsilyl, 2-ethylhexylsilyl, decylsilyl, 3,7-dimethyloctylsilyl, pentyldimethylsilyl, isoamyldimethylsilyl, hexyldimethylsilyl, octyldimethylsilyl, 2-ethylhexyldimethylsilyl, decyldimethylsilyl and 3,7-dimethyloctyl-dimethylsilyl.

The above described alkylamino group may be straight, branched or cyclic, and may be either monoalkylamino or dialkylamino, wherein the number of the carbon atoms is usually of the order of 1 to 40. Specific examples of the alkylamino group include methylamino, dimethylamino, ethylamino, diethylamino, propylamino, i-propylamino, butylamino, i-butylamino, t-butylamino, pentylamino, isoamylamino, hexylamino, cyclohexylamino, heptylamino, octylamino, 2-ethylhexylamino, nonylamino, decylamino, 3,7-dimethyloctylamino and laurylamino; among these preferable are pentylamino, isoamylamino, hexylamino, octylamino, 2-ethylhexylamino, decylamino and 3,7-dimethyloctylamino.

The above described arylsilyl group usually has about 6 to 60 carbon atoms; examples of the arylsilyl group include phenylsilyl, ($C_1$–$C_{12}$-alkoxy)phenylsilyl, ($C_1$–$C_{12}$-alkyl)phenylsilyl, 1-naphthylsilyl, 2-naphthylsilyl and dimethylphenylsilyl; among these preferable are ($C_1$–$C_{12}$-alkoxy)phenylsilyl and ($C_1$–$C_{12}$-alkyl) phenylsilyl.

The above described arylamino group usually has about 6 to 60 carbon atoms; examples of the arylamino group include phenylamino, diphenylamino, ($C_1$–$C_{12}$-alkoxy)phenylamino, di(($C_1$–$C_{12}$-alkoxy)phenyl)amino, di(($C_1$–$C_{12}$alkyl)phenyl)amino, 1-naphthylamino and 2-naphthylamino; among these preferable are ($C_1$–$C_{12}$alkyl) phenylamino and di(($C_1$–$C_{12}$alkyl)phenyl)amino.

The above described arylalkylsilyl group usually has about 7 to 60 carbon atoms; specific examples of the arylalkylsilyl group include phenyl-($C_1$–$C_{12}$alkyl)silyl, ($C_1$–$C_{12}$-alkoxy)phenyl-($C_1$–$C_{12}$alkyl)silyl, ($C_1$–$C_{12}$alkyl)phenyl-($C_1$–$C_{12}$alkyl)silyl, 1-naphthyl-($C_1$–$C_{12}$-alkyl)silyl, 2-naphthyl-($C_1$–$C_{12}$-alkyl)silyl and phenyl-($C_1$–$C_{12}$-alkyl) dimethylsilyl; among these preferable are ($C_1$–$C_{12}$-alkoxy) phenyl-($C_1$–$C_{12}$alkyl)silyl and ($C_1$–$C_{12}$alkyl)phenyl-($C_1$–$C_{12}$alkyl)silyl.

The above described arylalkylamino group usually has about 7 to 60 carbon atoms; specific examples of the arylalkylamino group include phenyl-($C_1$–$C_{12}$alkyl)amino, ($C_1$–$C_{12}$-alkoxy)phenyl-($C_1$–$C_{12}$alkyl)amino, ($C_1$–$C_{12}$alkyl)phenyl-($C_1$–$C_{12}$alkyl)amino, di(($C_1$–$C_{12}$-alkoxy)phenyl-($C_1$–$C_{12}$alkyl))amino, di(($C_1$–$C_{12}$alkyl)phenyl-($C_1$–$C_1$–$C_{12}$alkyl))amino, 1-naphthyl-($C_1$–$C_{12}$alkyl)amino and 2-naphthyl-($C_1$–$C_{12}$alkyl)amino; among these preferable are ($C_1$–$C_{12}$alkyl) phenyl-($C_1$–$C_{12}$alkyl)amino and di(($C_1$–$C_{12}$alkyl)phenyl-($C_1$–$C_{12}$alkyl) )amino.

The above described arylalkenyl group usually has about 8 to 60 carbon atoms; specific examples of the arylalkenyl group include phenyl-$C_1$–$C_{12}$-alkenyl, ($C_1$–$C_{12}$-alkoxy)phenyl-$C_1$–$C_{12}$-alkenyl, ($C_1$–$C_{12}$alkyl)phenyl-$C_1$–$C_{12}$-alkenyl, 1-naphthyl-$C_1$–$C_{12}$-alkenyl and 2-naphthyl-$C_1$–$C_{12}$-alkenyl; among these preferable are ($C_1$–$C_{12}$-alkoxy)phenyl-$C_1$–$C_{12}$-alkenyl and ($C_1$–$C_{12}$alkyl)phenyl-$C_1$–$C_{12}$-alkenyl.

The above described arylalkynyl group usually has about 8 to 60 carbon atoms; specific examples of the arylalkynyl group include phenyl-$C_1$–$C_{12}$-alkynyl, ($C_1$–$C_{12}$-alkoxy)phenyl-$C_1$–$C_{12}$alkynyl, ($C_1$–$C_{12}$alkyl)phenyl-$C_1$–$C_{12}$alkynyl, 1-naphthyl-$C_1$–$C_{12}$-alkynyl and 2-naphthyl-$C_1$–$C_{12}$-alkynyl; among these preferable are ($C_1$–$C_{12}$-alkoxy)phenyl-$C_1$–$C_{12}$-alkynyl and ($C_1$–$C_{12}$-alkyl)phenyl-$C_1$–$C_{12}$-alkynyl.

The above described alkylphenylethenyl group usually has about 9 to 60 carbon atoms, and preferably has an alkyl group having 1 to 12 carbon atoms.

The above described alkoxyphenylethenyl group usually has 9 to 60 carbon atoms, and preferably has an alkoxy group having 1 to 12 carbon atoms.

Specific preferable examples of the repeating unit represented by the above described formula (3) include the species shown below.

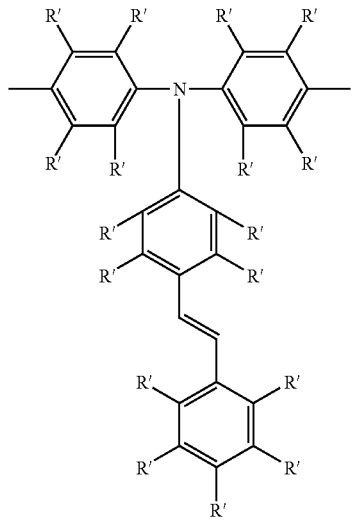

-continued
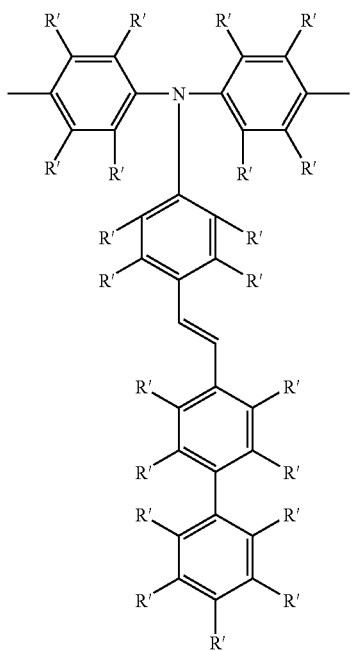
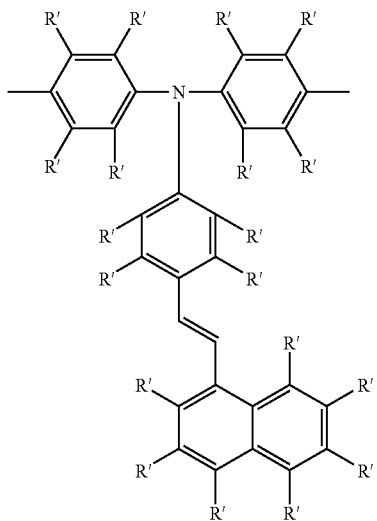
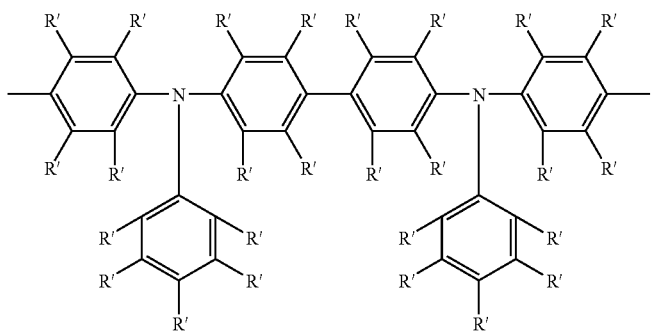

-continued
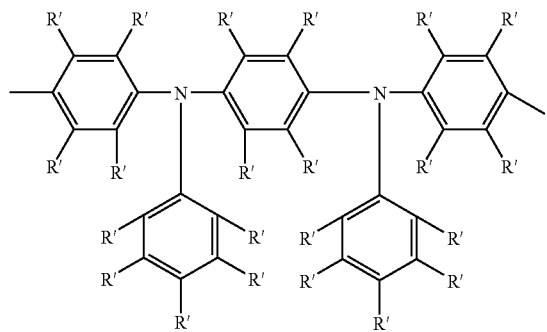
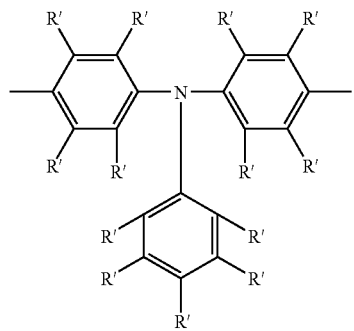
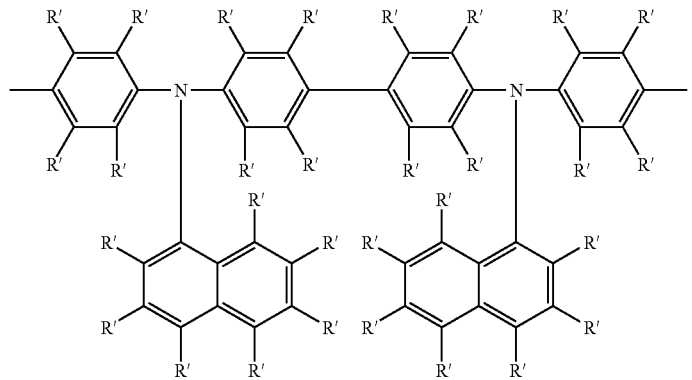
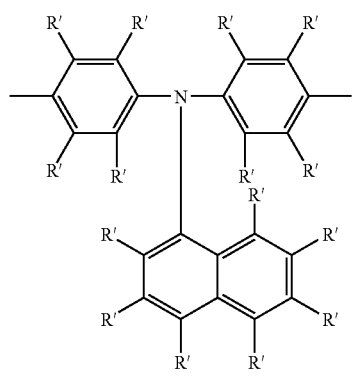

-continued

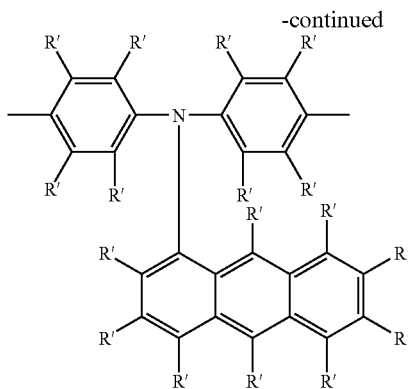

In the above shown species, each R' is independently hydrogen, alkyl, alkyloxy, alkylthio, alkylsilyl, alkylamino and the like.

The number average molecular weight of the copolymer comprising in the main chain thereof the repeating units represented by the general formulas (2) and (3), measured by gel permeation chromatography with polystyrene as standard, is usually of the order of $10^3$ to $10^8$, preferably $10^3$ to $10^7$, and more preferably $2 \times 10^3$ to $10^6$.

Additionally, the above described copolymer may be a random copolymer, block copolymer or graft copolymer, or a polymer having an intermediate structure therebetween such as a random copolymer partially having the nature of a block copolymer. For the purpose of obtaining a polymer having a high fluorescence quantum yield, a random copolymer partially having the nature of a block copolymer, a block copolymer and a graft copolymer are preferable to a completely random copolymer. Among the preferred copolymers are included those having a branch(es) on the main chain and 3 or more terminals, and dendrimers.

In the copolymer comprising in the main chain thereof the repeating units represented by the general formulas (2) and (3), one or more types of the repeating units represented by formula (2) and one or more types of the repeating units represented by formula (3) may be comprised.

In the above described copolymer, the amount of the repeating unit represented by formula (2) based on the total amount of the repeating units represented by formulas (2) and (3) is preferably 10 to 90 mol %, more preferably 40 to 90 mol %, further preferably 50 to 90 mol %, more preferably 60 to 80 mol %, and most preferably 70 to 80 mol %.

Incidentally, the above described copolymer may comprise repeating units other than the repeating units represented by formulas (2) and (3), as far as the fluorescence properties and charge transport properties of the copolymer are not adversely affected.

In the above described copolymer, the combined amount of the repeating units represented by formulas (2) and (3) based on the total repeating units of the copolymer is preferably 50 mol % or more, more preferably 60 mol % or more, further preferably 70 mol % or more, yet further preferably 80 mol %, particularly preferably 90 mol % or more, and most preferably substantially 100 mol %.

Additionally, in the above described copolymer, the repeating units represented by formulas (2) and (3) and other repeating units may be linked with nonconjugated units, or may contain nonconjugated repeating parts therein. Examples of the linkage structures concerned include those shown below, combinations of those shown below with vinylene groups, and combinations of the two or more of those shown below. Here, R" represents a group selected from the group consisting of a hydrogen atom, a $C_1$–$C_{20}$-alkyl group, a $C_6$–$C_{60}$-aryl group, and a $C_4$–$C_{60}$-heterocyclic group, and Ar''' represents a ($C_6$–$C_{60}$)hydrocarbon group.

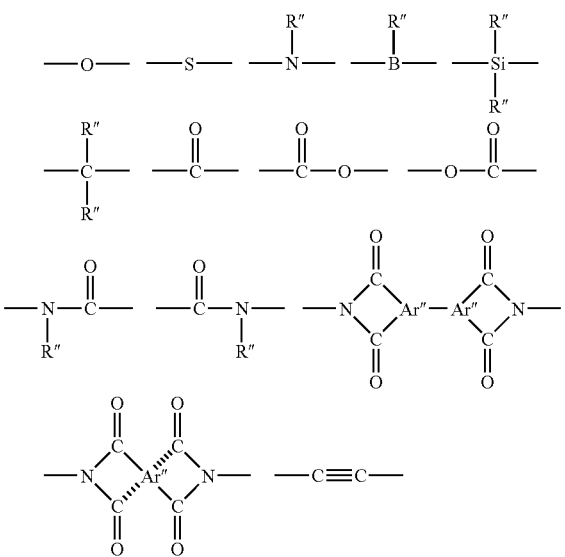

As far as the fluorescence properties and charge transport properties are not adversely affected, no particular constraint is imposed on the repeating units represented by formulas (2) and (3); specific examples of the repeating units concerned include fluorene, arylene, arylenevinylene, stilbene and stilbenevinylene.

Examples of the good solvent for the above described copolymer include chlorine based solvents such as chloroform, methylenechloride and dichloroethane; ether based solvents such as tetrahydrofuran and diethyl ether; and aromatic solvents such as toluene, xylene, mesitylene, 1,2,3,4-tetramethylbenzene, tetralin and n-butylbenzene. Depending on the structure and molecular weight thereof, usually the above described copolymer can be dissolved in these solvents in a concentration of 0.1 wt % or more, and is better in solubility in non-chlorine based solvents such as toluene, compared to the copolymer represented by the general formula (1).

Additionally, when the copolymer to be used in the present invention is used as the light emitting material of an EL device, the copolymers of the present invention which can emit fluorescence in the solid state are preferably used, because light emission from a thin film is utilized.

When the copolymer to be used in the present invention is used as the light emitting material of an EL device, because the purity thereof affects the light emitting properties thereof, it is preferable that the monomers prior to polymerization are purified by distillation, sublimation purification, recrystallization and the like and then subjected to polymerization; and it is also preferable that after synthesis, the copolymer is subjected to purification treatments including reprecipitation purification and fractionation by chromatography.

Examples of the synthetic method of the copolymer to be used in the present invention include a method for polymerization from the appropriate monomers by means of the Suzuki coupling reaction, a method for polymerization by means of the Grignard reaction, a method for polymerization using a Ni(0) catalyst, a method for polymerization with an oxidizing agent such as $FeCl_3$, a method for electrochemical oxidation polymerization, and a method taking advantage of decomposition of intermediate polymers having appropriate leaving groups. Among these, from the viewpoint of easy control of reaction, preferable are the method for polymerization by means of the Suzuki coupling reaction, the method for polymerization by means of the Grignard reaction, the method for polymerization using a Ni(0) catalyst; and more preferable are the method for polymerization by means of the Suzuki coupling reaction and the method for polymerization using a Ni(0) catalyst.

The Suzuki coupling reaction is described, for example, in Chemical Review, Vol. 95, p. 2457 (1995). The method for polymerization using a Ni(0) catalyst is described, for example, in Progressive Polymer Science, Vol. 17, pp. 1153–1205 (1992).

A specific description is made below of the Suzuki coupling reaction.

For example, in the case of the copolymer represented by the general formula (1), the copolymer can be produced by conducting polycondensation by reacting 2,7-dihalo-9-oxo-9-phosphafluorene, represented by the general formula (4):

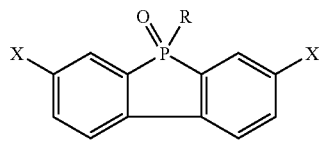

where R is defined as described above, and X stands for halogen, with an arylenebis(boronic acid) represented by the general formula (5):

$$(OH)_2B—Ar—B(OH)_2 \quad (5)$$

where Ar is defined as described above.

In the general formula (4), X represents halogen, and specific examples include chlorine, bromine and iodine. In the general formula (4), R is defined in the same manner as R in the above described general formula (1).

Additionally, in the general formula (5), Ar is defined as the same manner as Ar in the general formula (1).

Specific examples of preferably used arylenebis(boronic acid) include 1,2-phenylenebis(boronic acid), 1,3-phenylenebis(boronic acid), 1,4-phenylenebis(boronic acid), 2-methyl-1,4-phenylenebis(boronic acid), 2,5-dimethyl-1,4-phenylenebis(boronic acid), 2,3-dimethyl-1,4-phenylenebis (boronic acid), 1,4-dimethyl-2,3-phenylenebis(boronic acid), 2,3,5,6-tetramethyl-1,4-phenylenebis(boronic acid), 2,5-dimethoxy-1,4-phenylenebis(boronic acid), 2,5-dihexyloxy-1,4-phenylenebis(boronic acid), and 2,5-bis(1-methylheptyloxy)-1,4-phenylenebis(boronic acid).

Arylenebis(boronic acid) is used in a proportion of 0.5 to 2 equivalents and preferably 0.7 to 1.2 equivalents based on one equivalent of the compound of the above described general formula (4).

The above described polycondensation reaction proceeds at a preferable rate in the presence of a palladium catalyst. As the palladium catalysts, various types well known in the art can be used; among these, preferable are so-called low valent complexes, and particularly preferable are divalent complex with tertiary phosphine or tertiary phosphite ligands. Additionally, it is also a preferable mode to use appropriate precursors to be easily converted to low valency substances in the reaction system.

Additionally, it is also another preferable mode that a complex containing neither a tertiary phosphine nor a tertiary phosphite as the ligand and either a tertiary phosphine or a tertiary phosphite are mixed together in a reaction system, and thus a low valent complex with tertiary phosphine or phosphite ligands is formed in the reaction system. Various tertiary phosphines and tertiary phosphates can be mentioned as ligands obtainable by means of any one of the methods in these modes and capable of exhibiting advantageous performance.

Examples of the suitable ligand for use in the above described polycondensation reaction include triphenylphosphine, diphenylmethylphosphine, phenyldimethylphosphine, 1,4-bis(diphenylphosphino)butane, 1,3-bis(diphenylphosphino)propane, 1,1'-bis(diphenylphosphino) ferrocene, trimethylphosphite, and triphenylphosphite; these can be used in combinations thereof or each alone. Examples of the complex having neither a tertiary phosphine nor a tertiary phosphite as ligands include bis(dibenzylideneacetone)palladium, palladium acetate, dichloro(bisbenzonitrile)palladium, dichloro(1,5-cyclooctadiene)palladium(II), palladium(II)bishexafluoropentanedionate, and palladium (II)cispentanedionate; however, the examples are not limited to these. Additionally, examples of the preferably used phosphine or phosphite complex include dimethyl(triphenylphosphine)palladium, dimethylbis(diphenylmethylphosphine)palladium, dimethylbis(dimethylphenylphosphine)palladium, dimethylbis(triethylphosphine)palladium, (ethylene)bis(triphenylphosphine)palladium, tetrakis(triphenylphosphine)palladium, bis(tricyclohexylphosphine)palladium, and dichlorobis(triphenylphosphine)palladium.

A palladium complex is used in a proportion of 0.00001 to 20 equivalents and preferably 0.0001 to 2 equivalents based on one equivalent of the compound represented by the above described general formula (4).

In the above described coupling reaction based on the palladium complexes, the use of bases can attain preferable rates. Various inorganic and organic bases can be used as the bases. Examples of such bases include lithium carbonate, sodium carbonate, potassium carbonate, lithium hydroxide, sodium hydroxide, potassium hydroxide, lithium oxide, sodium acetate, potassium acetate, magnesium oxide, calcium oxide, barium hydroxide, trilithium phosphate, trisodium phosphate, tripotassium phosphate, cesium fluoride, cesium carbonate, aluminum oxide, trimethylamine, triethylamine, N,N,N',N'-tetramethylethylenediamine, diisopropylamine, diisopropylethylamine, N-methylpiperidine, 2,2,6,6-tetramethyl-N-methylpiperidine, pyridine, 4-dimethylaminopyridine, N-methylmorpholine, sodium ethoxide, and potassium tert-butoxide. A base is used usually in a proportion of 1 to 100 equivalents, and preferably in a proportion of 2 to 20 equivalents, based on 1 equivalent of the compound represented by the above described general formula (4).

The above described polycondensation reaction can be carried out at various temperatures; it is preferable that the reaction is carried out usually at −70 to 180° C., particularly at 0 to 150° C.

In the above described polycondensation reaction, it is preferable to use solvents. Examples of the preferable solvents include N,N-dimethylformamide, hexamethylphosphoric triamide, toluene, benzene, chloroform, tetrahydrofuran, and water. No constraint is imposed on the amount of the solvent used as far as the progress of the reaction is concerned; however, the amount of the solvent used is usually in a proportion of 0.1 to 100 mL, and more preferably in a proportion of 1 to 20 mL, based on 1 mmol of the compound represented by the above described general formula (4).

The isolation and purification of the product can be easily carried out by reprecipitation and the like.

Now, a description is made below of the method for performing polymerization on the basis of the Yamamoto polymerization method. In the Yamamoto polymerization method, usually a zero valent nickel complex is used and reacted with a halide in an ether based solvent such as tetrahydrofuran and 1,4-dioxane or in an aromatic hydrocarbon solvent such as toluene. Examples of the zero valent nickel complex include bis(1,5-cyclooctadiene)nickel(0), (ethylene)bis(triphenylphosphine)nickel(0), and tetrakis(triphenylphosphine)nickel; particularly preferable is bis(5-cyclooctadiene)nickel(0).

In the Yamamoto polymerization method, it is preferable to add a neutral ligand from the viewpoint of improving the yield and attaining high molecular weight.

Here, the neutral ligand means a ligand having no anions or cations. Examples of such ligands include nitrogen containing ligands such as 2,2'-bipyridyl, 1,10-phenanthroline, methylenebisoxazoline, N,N'-tetramethylethylenediamine; and tertiary phosphine ligands such as triphenylphosphine, tritolylphosphine, tributylphosphine and triphenoxyphosphine. Among these, nitrogen-containing ligands are preferable in view of versatility and low cost, and particularly preferable is 2,2'-bipyridyl in view of the high reactivity and high yield.

When a neutral ligand is used, the used amount thereof is, from the viewpoint of the reaction yield and cost, preferably of the order of 0.5 to 10 mol, more preferably 0.8 to 1.5 mol, and further preferably 0.9 to 1.1 mol, based on 1 mol of the zero valent nickel complex.

Particularly from the viewpoint of attaining a high molecular weight of the polymer, preferable is a system containing bis(1,5-cyclooctadiene)nickel(0) in which 2,2'-bipyridyl is added as a neutral ligand.

No constraint is imposed on the used amount of the zero valent nickel complex as far as the used amount is of the order such that the polymerization reaction is not inhibited; however, with too a small used amount, the molecular weight tends to be low, while with too a large used amount, posttreatments tend to be complicated. Accordingly, the used amount of the zero valent nickel complex is preferably 0.1 to 10 mol, more preferably 1 to 5 mol, and further preferably 2 to 3.5 mol, based on 1 mol of the monomers.

If the terminal groups in the copolymer represented by the general formula (1) and in the copolymer comprising in the main chain thereof the repeating units represented by the general formulas (2) and (3), both copolymers being to be used in the present invention, still hold the remaining polymerization activity, the light emitting properties and the operation life are possibly degraded when the copolymers are assembled in a device, so that these terminal groups may be protected with stable groups. It is preferable that the terminal groups have conjugated bonds continued to the conjugated structure of the main chain. Examples of such bonds include a structure in which the terminal groups are bonded to aryl groups or heterocyclic groups through the intermediary of carbon-carbon bonds. Specifically, the substituents and the like described in the chemical formula (10) in JP-A-9-45478 can be mentioned as examples.

Now, a description is made below of a polymer composition of the present invention.

The polymer composition to be used in the present invention comprises a polymer which exhibits fluorescence in the solid state and has a number average molecular weight of $10^3$ to $10^8$ in terms of polystyrene and the above described copolymer of the present invention.

No particular constraint is imposed on the above described polymer as far as the polymer can lead to improvement of solubility in solvents and properties, to be exhibited by a device incorporating the polymer, such as fluorescence intensity, operation life and luminance; specific examples of such polymers include the polymers described in JP-A-2001-247861, JP-A-2001-507511, JP-A-2001-504533, JP-A-2001-278958, JP-A-2001-261796, JP-A-2001-226469, and Japanese Patent No. 3161058; however, the polymer concerned is not limited to these polymers. More specific examples of the polymer concerned include polyfluorene compounds, polyfluorene copolymers, polyarylene compounds, polyarylene copolymer, polyarylene vinylene compounds, polyarylene vinylene copolymers, polystilbene compounds, polystilbene copolymers, polystilbene vinylene compounds, polystilbene vinylene copolymers, polypyridinediyl compounds, polypyridinediyl copolymers, alkoxypolythiophene compounds, and alkoxypolythiophene copolymers; however, the polymer concerned is not limited to these compounds. Among these, particularly preferable are the polyfluorene copolymers, polyarylene copolymers, polyarylene vinylene copolymers, polystilbene copolymers, and polystilbene vinylene copolymers.

No particular constraint is imposed on the mixing ratio of the copolymer as far as the mixing ratio can lead to improvement of solubility in solvents and properties, to be exhibited by a device incorporating the polymer, such as fluorescence intensity, operation life and luminance; however, the mixing ratio of the copolymer to be used in the present invention, based on the amount of the whole polymer composition, preferably falls within the range from 40 to 95 wt %, more preferably from 50 to 80 wt %, and further preferably 65 to 75 wt %.

Now, a description is made below of the EL device of the present invention. The EL device of the present invention is characterized in that the device comprises an organic layer between the electrodes comprising an anode and a cathode, and the above described organic layer comprises the copolymer to be used in the present invention or the polymer composition to be used in the present invention.

The film thickness of the organic layer comprising the copolymer or the polymer composition to be used in the present invention is 1 nm to 10 μm, preferably 5 nm to 1 μm, and more preferably 30 nm to 0.5 μm. With too a thin film thickness, pinholes tend to be formed, while with too a thick film thickness, the driving voltage of the device tends to become high.

A mode of the present invention is a device in which the organic layer comprising the copolymer or polymer composition to be used in the present invention is a light emitting layer.

Another mode of the present invention is a device in which the organic layer comprising the copolymer or polymer composition to be used in the present invention is an electron transport layer or a hole transport layer.

Here, it should be noted that the light emitting layer means a layer having light emitting function; the hole transport layer means a layer having hole transport function; and the electron transport layer means a layer having electron transport function. Additionally, the electron transport layer and the hole transport layer are named generically as the charge transport layer. The number of the used layers for the light emitting layer, that for the hole transport layer and that for the electron transport layer each independently may be two or more.

Examples of the EL device, in which the organic layer comprising the copolymer or polymer composition to be used in the present invention is a light emitting layer, include a device which has the above described light emitting layer between the electrodes comprising an anode and a cathode (for example, a) described below); and additionally, an EL device in which a hole transport layer is provided between the anode and the light emitting layer in a manner adjacent to the above described light emitting layer (for example, b) described below); an EL device in which an electron transport layer is provided between the cathode and the light emitting layer in a manner adjacent to the above described light emitting layer (for example, c) described below);and an EL device in which an electron transport layer is provided between the cathode and the light emitting layer in a manner adjacent to the above described light emitting layer and a hole transport layer is provided between the anode and the light emitting layer in a manner adjacent to the above described light emitting layer (for example, d) described below). The number of the used layers for the hole transport layer and/or the election transport layer may be two or more, and these transport layers may comprise the copolymer or the polymer composition to be used in the present invention. Additionally, the number of the used layers for the light emitting layer, comprising the copolymer or the polymer composition to be used in the present invention, may be two or more. Additionally, the EL device of the present invention may have a light emitting layer(s) which does not comprise the copolymer or the polymer composition to be used in the present invention, in addition to the light emitting layer(s) which comprises the copolymer or the polymer composition to be used in the present invention.

Specific examples include the devices which have the configurations a) to d) described below and in which the light emitting layer comprises the copolymer or the polymer composition to be used in the present invention:

a) anode/light emitting layer/cathode
b) anode/hole transport layer/light emitting layer/cathode
c) anode/light emitting layer/electron transport layer/cathode
d) anode/hole transport layer/light emitting layer/electron transport layer/cathode (Here, "/" means that the layers on both sides of each "/" are laminated adjacently. The same is applicable to what follows.)

EL devices in which the organic layer comprising the copolymer or polymer composition to be used in the present invention is an electron transport layer or a hole transport layer, comprise a light emitting layer which does not comprise the copolymer or polymer composition to be used in the present invention, between the anode and the cathode.

Specific examples concerned include the devices which have the above described configurations b) to d) and in which the light emitting layer is a light emitting layer comprising neither the copolymer nor the polymer composition to be used in the present invention, but the hole transport layer and/or the electron transport layer is a layer comprising the copolymer or polymer composition to be used in the present invention.

The electron transport layer is provided between the cathode and the light emitting layer, and the hole transport layer is provided between the anode and the light emitting layer. An EL device which has one of or both of these is also included in the present invention. Among these, preferable is a device having the light emitting layer adjacent to the electron transport layer or the hole transport layer.

The organic layer comprising the copolymer or polymer composition to be used in the present invention, may comprise one or more selected from the group consisting of a hole transport material, an electron transport material and a light emitting material, in addition to the copolymer or polymer composition to be used in the present invention.

Among others, the following EL devices are respectively preferable: an EL device in which the organic layer comprising the copolymer or polymer composition to be used in the present invention, comprises the copolymer or polymer composition to be used in the present invention and a hole transport material, from the viewpoint of enhancing the efficiency and lowering the voltage; an EL device in which the organic layer comprising the copolymer or polymer composition to be used in the present invention, comprises the copolymer or polymer composition to be used in the present invention and an electron transport material, from the viewpoint of enhancing the efficiency and lowering the voltage; an EL device in which the organic layer comprising the copolymer or polymer composition to be used in the present invention, comprises the copolymer or polymer composition to be used in the present invention and a light emitting material, from the viewpoint of controlling the color of emitted light; and an EL device in which the organic layer comprising the copolymer or polymer composition to be used in the present invention, comprises the copolymer or polymer composition to be used in the present invention, a light emitting material and a hole transport material and/or an electron transport material, from the viewpoint of controlling the color of emitted light, enhancing the efficiency and lowering the voltage.

When the copolymer or polymer composition to be used in the present invention is mixed with a hole transport material, the mixing proportion of the hole transport material based on the total amount of all the organic materials is 1 wt % to 80 wt %, preferably 5 wt % to 60 wt %. When the copolymer or polymer composition to be used in the present invention is mixed with an electron transport material, the mixing proportion of the electron transport material based on the total amount of all the organic materials is 1 wt % to 80 wt %, preferably 5 wt % to 60 wt %. Additionally, when the copolymer or polymer composition to be used in the present invention is mixed with a light emitting material, the mixing proportion of the light emitting material based on the total amount of all the organic materials is 0.1 wt % to 80 wt %, preferably 1 wt % to 60 wt %. When the copolymer or polymer composition to be used in the present invention is mixed with a light emitting material, a hole transport material and/or an electron transport material, the mixing proportion of the light emitting material based on the total amount of all the organic materials is 0.1 wt % to 50 wt %, preferably 1 wt % to 40 wt %, and the mixing proportion of the hole transport material and/or the electron transport material, in total, based on the total amount of all the organic materials is in total 1 wt % to 50 wt %, preferably 5 wt % to 40 wt %.

For the hole transport material, electron transport material and light emitting material to be mixed, either low molecular weight compounds or polymers, known in the art, can be used; however, it is preferable to use polymers. Specific examples of the hole transport material, electron transport material and light emitting material are described below.

Examples of the polymers for the hole transport material, electron transport material and light emitting material include polyfluorene and derivatives and copolymers thereof; polyarylene and derivatives and copolymers thereof; and polyarylene vinylene and derivatives and copolymers thereof; and (co)polymers of aromatic amines and derivatives thereof; these being disclosed in: WO 99/13692, WO 99/48160, GB 2340304A, WO 00/53656, WO 01/19834, WO 00/55927, GB 2348316, WO 00/46321, WO 00/06665, WO 99/54943, WO 99/54385, U.S. Pat. No. 5,777,070, WO 98/06773, WO 97/05184, WO 00/35987, WO 00/53655, WO 01/34722, WO 99/24526, WO 00/22027, WO 00/22026, WO 98/27136, U.S. Pat. No. 573,636, WO 98/21262, U.S. Pat. No. 5,741,921, WO 97/09394, WO 96/29356, WO 96/10617, EP No. 0707020, WO 95/07955, JP-A-2001-181618, JP-A-2001-123156, JP-A-2001-3045, JP-A-2000-351967, JP-A-2000-303066, JP-A-2000-299189, JP-A-2000-252065, JP-A-2000-136379, JP-A-2000-104057, JP-A-2000-80167, JP-A-10-324870, JP-A-10-114891, JP-A-9-111233, JP-A-9-45478, and the like.

As the polymers for the hole transport material, the compounds described in the documents cited above as examples are more preferably used; however, polymers other than these, for example, polyvinylcarbazole and derivatives thereof, polysilane and derivatives thereof, polysiloxane derivatives having aromatic amines in the main chain or side chains thereof, polyaniline and derivatives thereof, polythiophene and derivatives thereof, polypyrrole and derivatives thereof, and poly(2,5-thienylenevinylene) and derivatives thereof can also be used.

Examples of the low molecular weight compounds for the hole transport material include pyrazoline derivatives, arylamine derivatives, stilbene derivatives, and triphenyldiamine derivatives.

As the polymers for the electron transport material, other than the compounds described in the documents cited above as examples, polyquinoline and derivatives thereof, and polyquinoxaline and derivatives thereof may be used.

Examples of the low molecular weight compounds for the electron transport material include oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, and metal complexes of 8-hydroxyquinoline and derivatives thereof.

As the hole transport materials and electron transport materials, specifically, the compounds described in the following documents and the like compounds can be preferably used: JP-A-63-70257, JP-A-63-175860, JP-A-2-135359, JP-A-2-135361, JP-A-2-209988, JP-A-3-37992 and JP-A-3-152184.

As for these hole transport materials and these electron transport materials, the layers made of these materials can be laminated with the organic layer comprising the copolymer and polymer composition of the present invention, in addition to the case where these materials are mixed in the organic layer comprising the copolymer and polymer composition of the present invention; in this connection, no particular constraint is imposed, but generally, a material soluble in the same solvent as the solvent in which the above described copolymer is soluble is used as a mixture with the copolymer, and a material not soluble in the above described manner is used by lamination.

As the low molecular weight compounds for the light emitting material, for example, the following compounds can be used: naphthalene and derivatives thereof, anthracene and derivatives thereof, perylene and derivatives thereof, dyes such as polymethine dyes, xanthene dyes, coumarin dyes and cyanine dyes, metal complexes of 8-hydroxyquinoline and derivatives thereof, aromatic amines, tetraphenylcyclopentadiene and derivatives thereof, and tetraphenylbutadiene and derivatives thereof, and the like. More specific descriptions are found, for example, in JP-A-57-51781 and JP-A-59-194393.

No constraint is imposed on the film formation method for the organic layer comprising the copolymer or polymer composition to be used in the present invention, but a film formation method from a solution can be mentioned as an example. Additionally, when the copolymer or polymer composition of the present invention and one or more of a light emitting material, a hole transport material and an electron transport material are mixed together, a method can be mentioned as an example in which these are dissolved in a common solvent and a film is formed from the mixed solution thus prepared.

No particular constraint is imposed on the solvent used in the film formation from a solution, as far as the solvent can dissolve the copolymer presented in the present invention and the material to be mixed with the copolymer. Specifically, examples of the good solvent for the above described copolymer of the present invention are listed; more preferably used are chlorine based solvents such as chloroform, methylene chloride and dichloroethane, aromatic compound solvents such as toluene, xylene, mesitylene, 1,2,3,4-tetramethylbenzene and n-butylbenzene, and the like. Among these solvents, particularly toluene, xylene and chloroform are widely used. The correlation between the solvent used for film formation and the properties of the device is not clear, but it is desirable that the copolymer can be dissolved in various solvents.

When the EL device of the present invention has a hole transport layer, the above described hole transport materials can be used as the material for the hole transport layer, other than the copolymer and the polymer composition to be used in the present invention.

No constraint is imposed on the film formation method of the hole transport layer; however, for a low molecular weight hole transport material, a method based on the film formation from a mixed solution of the hole transport material and a polymer binder can be mentioned as an example, while for a polymer hole transport material, a method based on film formation from a solution can be mentioned as an example.

The film thickness of the hole transport layer may be selected so as for the driving voltage and light emitting efficiency to have appropriate values, though the optimal value thereof depends on the material used. At least a thickness for which no pinholes are generated is necessary, while too large a thickness is not preferable because the driving voltage becomes high. Accordingly, the film thickness of the hole transport layer is, for example, 1 nm to 1 µm, preferably 2 nm to 500 nm, and further preferably 5 nm to 200 nm.

When the EL device of the present invention has an electron transport layer, the above described electron transport material can be used as the material for the electron transport layer, other than the copolymer or polymer composition to be used in the present invention.

No particular constraint is imposed on the film formation method for the electron transport layer; however, for the low molecular weight electron transport material, a method of vacuum deposition from powder and a method for film formation from a solution or a molten state can be mentioned as examples; and for the polymer electron transport material, a method for film formation from a solution or a molten state can be mentioned as an example. When the film formation from a solution or a molten state is carried out, a polymer binder may be used at the same time.

The film thickness of the electron transport layer may be selected so as for the driving voltage and light emitting efficiency to have appropriate values, though the optimal value thereof depends on the material used. At least a thickness for which no pinholes are generated is necessary, while too large a thickness is not preferable because the driving voltage becomes high. Accordingly, the film thickness of the above described electron transport layer is, for example, 1 nm to 1 µm, preferably 2 nm to 500 nm, and further preferably 5 nm to 200 nm.

No particular constraint is imposed on the solvent used in the film formation of the hole transport layer or the electron transport layer from a solution, as far as the solvent can dissolve the hole transport material or the electron transport material and the polymer binder used according to need. Examples of the solvent include chlorine based solvents such as chloroform, methylene chloride and dichloroethane, ether based solvents such as tetrahydrofuran, aromatic hydrocarbon solvents such as toluene and xylene, ketone based solvents such as acetone, methyl ethyl ketone, and ester based solvents such as ethyl acetate, butyl acetate and ethyl cellusolve acetate.

As the polymer binder mixed, according to need, in the hole transport material or the electron transport material, preferable is a binder which does not hinder the charge transport to an extreme extent or a binder which does not strongly absorb visible light. Examples of the polymer binder include poly(N-vinylcarbazole), polyaniline and derivatives thereof, polythiophene and derivatives thereof, poly(p-phenylene vinylene) and derivatives thereof, poly(2, 5-thienylene vinylene) and derivatives thereof, polycarbonate, polyacrylate, polymethylacrylate, polymethylmethacrylate, polystyrene, polyvinyl chloride, and polysiloxane.

The EL device of the present invention may comprise layers other than the anode, cathode, light emitting layer, hole transport layer and electron transport layer.

Examples of such layers include a charge injection layer or an insulating layer of 10 nm or less in thickness, arranged adjacent to an electrode for the purpose of enhancing the adhesivity to the electrode and improving the charge injection from the electrode, and a thin buffer layer arranged on the interface adjacent to the charge transport layer or the light emitting layer for the purpose of enhancing the adhesivity of the interface and preventing mixing thereof.

Here, it should be noted that a layer arranged adjacent to the electrode and having the function for improving the efficiency of the charge injection from the electrode and also having the effect for lowering the driving voltage of the device is referred to as a charge injection layer (hole injection layer or electron injection layer). The order and number of the laminated layers and the thickness of each of the layers can be appropriately determined in consideration of the light emitting efficiency and the operation life of the device.

In the present invention, the EL device provided with a charge injection layer (electron injection layer or hole injection layer) includes an EL device with a charge injection layer arranged adjacent to the cathode and an EL device with a charge injection layer arranged adjacent to the anode can be mentioned as examples. Specifically, the following examples e) to p) are presented:

e) anode/charge injection layer/light emitting layer/cathode
f) anode/light emitting layer/charge injection layer/cathode
g) anode/charge injection layer/light emitting layer/charge injection layer/cathode
h) anode/charge injection layer/hole transport layer/light emitting layer/cathode
i) anode/hole transport layer/light emitting layer/charge injection layer/cathode
j) anode/charge injection layer/hole transport layer/light emitting layer/charge injection layer/cathode
k) anode/charge injection layer/light emitting layer/electron transport layer/cathode
l) anode/light emitting layer/electron transport layer/charge injection layer/cathode
m) anode/charge injection layer/light emitting layer/electron transport layer/charge injection layer/cathode
n) anode/charge injection layer/hole transport layer/light emitting layer/electron transport layer/cathode
o) anode/hole transport layer/light emitting layer/electron transport layer/charge injection layer/cathode
p) anode/charge injection layer/hole transport layer/light emitting layer/electron transport layer/charge injection layer/cathode Specific examples of the charge injection layer include a layer containing a conductive polymer; a layer arranged between the anode and the hole transport layer and comprising a material having an ionization potential between that of the anode material and that of the hole transport material contained in the hole transport layer; and a layer arranged between the cathode and the electron transport layer and comprising a material having an electron affinity between that of the cathode material and that of the electron transport material contained in the electron transport layer.

When the above described charge injection layer is a layer comprising a conductive polymer, the layer is arranged between at least one of the electrodes and the light emitting layer in a manner adjacent to the electrode.

The electric conductivity of the above described conductive polymer preferably is $10^{-7}$ S/cm or more and $10^3$ S/cm or less, more preferably $10^{-5}$ S/cm or more and $10^2$ S/cm or less for the purpose of decreasing the leak current between light emitting pixels, and further preferably $10^{-5}$ S/cm or more and $10^1$ S/cm or less. Usually, for the purpose of making the electric conductivity of the above described conductive polymer be $10^{-5}$ S/cm or more and $10^3$ S/cm or less, ions are doped into the conductive polymer in an appropriate amount.

The type of the ions doped is anionic for the hole injection layer and cationic for the electron injection layer. Examples of the anions include polystyrenesulfonate ion, alkylbenzenesulfonate ion and camphorsulfonate ion, and examples of the cations include lithium ion, sodium ion, potassium ion and tetrabutyl ammonium ion.

The film thickness of the charge injection layer is, for example, 1 nm to 150 nm, preferably 2 nm to 100 nm.

The material used for the charge injection layer may be appropriately selected in consideration of the correlations with the materials for the electrodes and the adjacent layers; examples of the material for the charge injection layer include conductive polymers such as polyaniline and derivatives thereof, polythiophene and derivatives thereof, polypyrrole and derivatives thereof, polyphenylene vinylene and derivatives thereof, polythienylene vinylene and derivatives thereof, polyquinoline and derivatives thereof, polyquinoxaline and derivatives thereof, and copolymers containing aromatic amine structures in main chain and side chains; metal phthalocyanine (copper phthalocyanine and the like); and carbon.

As the material for the 10 nm or less thick insulating layer(s) arranged adjacent to the cathode and/or the anode for the purpose of facilitating the charge injection, metal fluorides, metal oxides and organic insulating materials can be mentioned; among these preferable are fluorides and oxides of alkali metals, alkaline earth metals and the like.

The film formation from solution is mentioned as an example of the film formation method for the organic layers (the light emitting layer and charge transport layer) comprising the copolymer or polymer composition of the present invention, and the light emitting layer, charge transport layer and charge injection layer, each comprising none of the above described copolymer or polymer composition, as hitherto described. The film formation can be carried out by applying a solution and merely subsequently drying to remove the solvent; additionally, even when a charge transport material and a light emitting material are mixed, a similar technique can be applied, so that the film formation from solution is very advantageous from the viewpoint of production. As the film formation method from solution, the following coating methods can be used: the spin coating method, casting method, micro gravure coating method, gravure coating method, bar coating method, roll coating method, wire bar coating method, dip coating method, spray coating method, screen printing method, flexo printing method, offset printing method, inkjet printing method and the like. Additionally, as for the charge injection material, the film formation can be carried out by using the dispersion in which the charge injection material is dispersed as emulsion in water or an alcohol, on the basis of the same method as applied for solutions. Additionally, for the film formation from inorganic compounds for forming insulating layers, the vacuum deposition method can be mentioned as an example.

The substrate on which the EL device of the present invention is formed can be any type of substrate as far as it is not changed during formation thereon of the electrodes and the individual layers in the EL device; for example, glass, plastic, polymer film, silicon substrates and the like can be mentioned as examples. When the substrate is opaque, it is preferable that the opposite electrode is either transparent or translucent.

Usually, at least one of the electrodes comprising the anode and cathode of the EL device of the present invention, is transparent or translucent and preferably, the anode is transparent or translucent.

As the material of the anode, conductive metal oxides, translucent metals and the like are used. Specifically, there are used indium oxide, zinc oxide and tin oxide; conductive glass (NESA and the like) composed of indium tin oxide (ITO), indium zinc oxide and the like, which are composites of the above described oxides; and gold, platinum, silver, copper and the like. Among these materials, ITO, indium zinc oxide and tin oxide are preferable. As the anode, there may also be used organic transparent conductive films made of polyaniline and derivatives thereof, polythiophene and derivatives thereof and the like.

The thickness of the anode can be appropriately selected in consideration of the light transmittance and electric conductivity of the anode and is, for example, 10 nm to 10 µm, preferably 20 nm to 1 µm, and more preferably 50 nm to 500 nm.

As the fabrication method of the anode, the vacuum deposition method, sputtering method, ion plating method, plating method and the like can be mentioned.

As the materials for the cathode used in the EL device of the present invention, preferable are the materials which are small in work function. For example, there are used metals such as lithium, sodium, potassium, rubidium, cesium, beryllium, magnesium, calcium, strontium, barium, aluminum, scandium, vanadium, zinc, yttrium, indium, cerium, samarium, europium, terbium, ytterbium and the like; alloys comprising two or more of these metals; alloys comprising one or more of these metals with one or more of gold, silver, platinum, copper, manganese, titanium, cobalt, nickel, tungsten and tin; and graphite or graphite intercalation compounds and the like. Examples of alloys include a magnesium-silver alloy, magnesium-indium alloy, magnesium-aluminum alloy, indium-silver alloy, lithium-aluminum alloy, lithium-magnesium alloy, lithium-indium alloy, calcium-aluminum alloy and the like. The cathode may be formed into a laminated structure of two or more layers.

The thickness of the cathode can be appropriately selected in consideration of the electric conductivity and durability of the cathode and is, for example, 10 nm to 10 µm, preferably 20 nm to 1 µm, and further preferably 50 nm to 500 nm.

The fabrication method of the cathode includes vacuum deposition, sputtering, lamination in which a metal thin film is subjected to thermocompression bonding, and the like.

After fabrication of the cathode, a protective layer for protecting the above described EL device may be provided. For the purpose of stable and long-period use of the above described EL device, it is preferable to provide a protective layer and/or a protective cover so that the EL device may be protected against the damage from the outside.

For the protective layer, polymers, metal oxides, metal nitrides, metal nitride oxides, metal fluorides, metal borides and the like can be used. For the protective cover, a glass plate and a plastic plate in which the surface thereof is treated so as to acquire low water permeability, and the like can be used; and a method is preferably used in which the above described cover is bonded to the device substrate with a thermosetting resin or a light-curing resin for sealing. If space is maintained using a spacer, it is possible to easily prevent the device from being damaged. If an inert gas such as nitrogen or argon is sealed in this space, it is possible to prevent the oxidation of the cathode, and further, by placing a desiccant such as barium oxide, calcium oxide and the like in the above described space, it becomes easy to suppress the performance degradation of the device caused by the moisture adsorbed in the course of fabrication. It is preferable that any one or more of these measures are adopted.

The EL device of the present invention can be used as a flat light source, a segment display, a dot matrix display, and a back light for a liquid crystal display.

For the purpose of obtaining plane light emission by use of the EL device of the present invention, a plane anode and a plane cathode have only to be arranged so as to superpose each other. For the purpose of obtaining pattern-shaped light emission, there are available a method in which a mask having pattern-shaped windows is arranged on the surface of the above described plane light emitting device; a method in which the thickness values of the organic layer portions corresponding to the non-light-emitting portions are made extremely large and hence these portions are substantially made non-light-emitting; and a method in which either or both electrodes of the anode and the cathode are formed in a pattern shape. By forming patterns by means of any one of these methods and by arranging some electrodes so as to be able to be independently turned on/off, a segment type display device which can display digits, letters, simple symbols and the like can be obtained. Furthermore, for the purpose of obtaining a dot matrix device, the anode and the cathode have only to be both formed in stripe shapes so that the anode stripes and the cathode stripes are arranged to cross each other. A method in which a plurality of types of copolymers different in emitting light colors are arranged separately, or a method in which color filters or fluorescence conversion filters are used, can provide a partial color display and a multi-color display. A dot matrix device can be driven by passive driving or by active driving combined with a thin film transistor in which amorphous silicon or low-temperature polysilicon is used. These display devices can be used as displays for computers, television sets, portable terminals, cellular phones, car navigation sets, viewfinders of video cameras and the like.

Additionally, the above described plane light emitting device is a self-luminous thin device, and can be preferably used as a flat light source providing a back light for a liquid crystal display or as a flat light source for illumination. If a flexible substrate is used, the plane light emitting light source can also be used as a curved plane light source or display.

For the purpose of describing the present invention in more detail, examples are presented below, but the present invention is not limited by these examples.

Here, the weight average molecular weights and the number average molecular weights were obtained as the average molecular weights in terms of polystyrene by means of gel permeation chromatography (GPC) with chloroform as solvent.

REFERENCE EXAMPLE 1

<Synthesis of Copolymer 1>

Under an atmosphere of nitrogen, a mixture composed of tetrakis(triphenylphosphine)palladium(0) (0.012 g) and 2,7-dibromo-9-oxo-9-nonyl-9-phosphafluorene (0.484 g), 2,5-dihexyloxyphenylene diboronic acid (0.367 g), potassium phosphate (2.0 g), and N,N-dimethylformamide (10 ml) was heated at 125° C. and stirred at this temperature for 48 hours. The reaction mixture was poured into water (100 ml) and the obtained powder was filtered. The powder was washed with water (50 ml), dissolved in chloroform (5 ml) and reprecipitated with methanol (100 ml) to obtain copolymer 1 which conceivably had the structure described below on the basis of the $^1$H-NMR spectrum and elemental analysis. The number and weight average molecular weights obtained by gel permeation chromatography were $1.01 \times 10^4$ and $2.2 \times 10^4$, respectively.

The NMR spectral data and the results of elemental analysis are as follows:

$^1$H-NMR(CDCl$_3$): δ 0.86(6H, brs), 1.31(16H, brs), 1.64 (12H, brs), 1.77(2H, brs), 4.02(4H, brs), 7.10(2H, m), 7.84 to 7.87(2H, m), 7.83 to 7.93(2H, m), 8.09(2H, d, J=9.3 Hz); $^{31}$P-NMR(CDCl$_3$): δ 43.9; Elemental analysis: Calculated values with the assumption of n=13 (C$_{526}$H$_{714}$O$_{40}$P$_{14}$Br$_2$): C, 76.45; H, 8.68; Br, 1.93; Observed values: C, 76.61; H, 8.83; Br, 2.20.

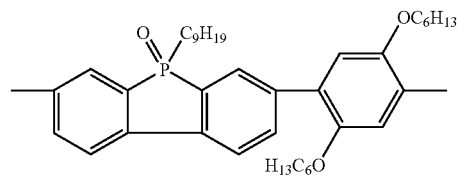

REFERENCE EXAMPLE 2

<Synthesis of Copolymer 2>

The following copolymer 2 was synthesized according to the same method as applied to the above described synthesis of copolymer 1 except that 2,7-dibromo-9-oxo-9-(1-methylheptyl)-9-phosphafluorene was used in place of 2,7-dibromo-9-oxo-9-nonyl-9-phosphafluorene.

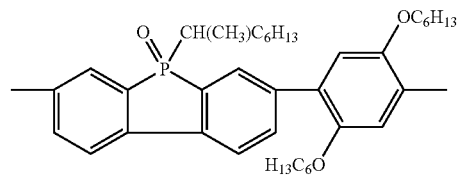

REFERENCE EXAMPLE 3

<Synthesis of Polymeric Fluorescent Substance 1>

1,4-dibromo-2,5-di(3,7-dimethyloctyloxy)benzene (0.41 gm, 0.75 mmol), 4,4'-dibromo- 2,5-di(3,7-dimethyloctyloxy)stilbene (0.488 g, 0.75 mmol) and 2,2'-bipyridyl (0.55 g) were placed in a reaction vessel and thereafter the air in the interior of the reaction system was replaced with argon gas. To this mixture, tetrahydrofuran (dehydrated) (40 ml), beforehand dearated by bubbling with argon gas, was added. Then, this mixed solution was mixed with bis(1,5-cyclooctadiene)nickel(0) (0.96 g), stirred at room temperature for 10 minutes, and then allowed to react at 60° C. for 7 hours. It should be noted that the reaction was carried out in an atmosphere of argon gas. After termination of the reaction, this solution was cooled and then poured into a mixed solution composed of 25% aqueous ammonia (10 ml), methanol (150 ml) and ion exchange water (50 ml), and then stirred for about 1 hour. Then, the mixed solution was allowed to stand and thereby was separated into two layers. The upper layer was recovered and the resulting solution was poured into methanol for reprecipitation. The generated precipitate was recovered. The precipitate was dried and then dissolved in chloroform. The solution was filtered to remove undissolved substances, and then poured into methanol for reprecipitation. The generated precipitate was recovered. The precipitate was dried under reduced pressure to obtain a copolymer (0.24 g). The copolymer is referred to as polymeric fluorescent substance 1.

The number and weight average molecular weights of polymeric fluorescent substance 1 were $7.3 \times 10^4$ and $2.1 \times 10^5$, respectively.

REFERENCE EXAMPLE 4

<Synthesis of Hole Transporting Polymer 1>

A copolymer was obtained in the same manner as in the synthesis of polymeric fluorescent substance 1 except that the ratio of 1,4-dibromo-2,5-di(3,7-dimethyloctyloxy)benzene to N,N'-diphenyl-N,N'-di(3-methyl-4-bromophenyl) benzidine was made to be 1:1. The copolymer thus obtained is referred to as hole transport polymer 1.

The number and weight average molecular weights of hole transport polymer 1 were $1.6 \times 10^4$ and $4.2 \times 10^4$, respectively.

Example 1

On a glass substrate with a 150 nm thick ITO film deposited by the sputtering method, a 50 nm thick film was formed by spin coating using a solution of poly(ethylene dioxythiophene)/polystyrene sulfonic acid (Baytron P®, Bayer Co.) and dried at 120° C. for 10 minutes on a hot plate. Then, a film of Copolymer 1 obtained above was formed by spin coating at a revolution rate of 1,500 rpm using a chloroform solution of Copolymer 1 prepared to have a concentration of 1.0 wt %. The laminated article was further dried under reduced pressure at 80° C. for 1 hour to form a cathode buffer layer, on which as the cathode, calcium was deposited in a thickness of about 20 nm and then aluminum was deposited in a thickness of about 50 nm, thus yielding an EL device. It should be noted that the metal deposition was started after the degree of vacuum reached $1 \times 10^{-4}$ Pa or below. Application of voltage to the thus obtained EL device provided emission of EL from Copolymer 1 with a peak at 480 nm. The intensity of the EL emission was approximately proportional to the current density. The above described device exhibited a luminance exceeding 1 cd/m$^2$ at about 12.5 V, and a maximum efficiency of 0.18 cd/A.

Example 2

A device in which Copolymer 1 and Hole Transporting Polymer 1 were used was obtained in the same manner as in Example 1 except that, in place of Copolymer 1 in Example 1, a mixture of Copolymer 1 and Hole Transporting Polymer 1 was used. In this case, the mixed content of Hole Transporting Polymer 1 was 27 wt %.

From this device, an EL emission was obtained with a peak at 472 nm. The intensity of the EL emission was approximately proportional to the current density. The above described device exhibited a luminance exceeding 1 cd/m$^2$ at about 13.5 V, and a maximum efficiency of 0.37 cd/A.

Example 3

A device in which Copolymer 2 was used was obtained in the same manner as in Example 1 except that, in place of Copolymer 1 in Example 1, Copolymer 2 was used. From this device, an EL emission was obtained with a peak at 496 nm. The intensity of the EL emission was approximately proportional to the current density.

The above described device exhibited a luminance exceeding 1 cd/m$^2$ at about 14.3 V and a maximum efficiency of 0.017 cd/A.

Example 4

A device was fabricated in the same manner as in Example 2 except that Copolymer 2 was used in place of Copolymer 1 in Example 2. Thus an EL device in which a film of a mixture of Copolymer 2 and Hole Transporting Polymer 1 was used was obtained. In this case, the mixed content of Hole Transporting Polymer was about 18 wt %.

From this device, an EL emission was obtained with a peak at 476 nm. The intensity of the EL emission was approximately proportional to the current density. The above described device exhibited a luminance exceeding 1 cd/M$^2$ at about 11.4 V and a maximum efficiency of 0.16 cd/A.

Example 5

An EL device was fabricated in the same manner as in Example 4 except that Polymeric Luminescent Substance 1 was mixed in addition to Copolymer 2 and Hole Transporting Polymer 1 in Example 4. In this case, the mixed contents of Hole Transport Polymer 1 and Polymeric Luminescent Substance 1 were 13 wt % and 19 wt %, respectively.

From this device, an EL emission was obtained with a peak at 472 nm. The intensity of the EL emission was approximately proportional to the current density. The above described device exhibited a luminance exceeding 1 cd/M$^2$ at about 8.8 V and a maximum efficiency of 0.72 cd/A.

Example 6

<Synthesis of Copolymer 6>

Under an atmosphere of nitrogen, a mixture composed of tetrakis(triphenylphosphine)palladium(0) (0.004 g) and 2,7-dibromo-9-oxo-9-nonyl-9-phosphafluorene (0.556 g), N,N'-bis(4-phenyl boronic acid bisethyl glycol cyclic ester)-N,N'-(bis-4-n-butylphenyl)-1,4-phenylene diamine (0.840 g) and toluene (10 g) was heated at 105° C. and stirred at this temperature for 18 hours. Then, the mixture was mixed with bromobenzene (0.28 g), stirred at 105° C. for 2 hours, then mixed with 2,5-dihexyloxyphenylene diboronic acid (0.22 g), and further stirred at 105° C. for 2 hours. Then, the reaction mixture was cooled to room temperature, then poured into methanol (200 ml), from which the obtained precipitate was filtered and subjected to vacuum drying at 50° C. for 2 hours. The powder thus obtained was dissolved in toluene (50 ml) and purified by passing the solution through a column charged with alumina (15 mL). The solution was concentrated to about 20 g and then dropped into methanol (200 mL). The powder thus obtained was filtered and dried under vacuum at 50° C. for 2 hours. Copolymer 6 thus obtained weighed 0.40 g.

ammonia (200 ml), methanol (1,200 mL) and ion exchange water (1,200 mL); then the mixed solution was stirred for 30 minutes and the precipitate separated out was filtered and air-dried. Then, the precipitate was dissolved in toluene (1,100 mL). The solution was filtered. The filtrate was

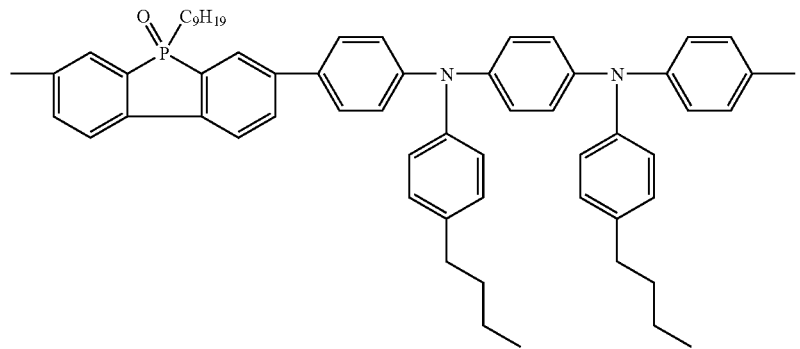

The number and weight average molecular weights of Copolymer 6 in terms of polystyrene were $7.4 \times 10^3$ and $1.2 \times 10^4$, respectively. Copolymer 6 (1 part by weight) and chloroform (about 99 parts by weight) were mixed together, and the mixture was stirred at room temperature (about 25° C.) with a magnetic stirrer. The copolymer was found to be dissolved in chloroform within 30 minutes.

The use of toluene in place of chloroform resulted in the same result.

Example 7

<Evaluation of Fluorescence Properties>

A 0.4 wt % chloroform solution of Copolymer 6 was spin-coated on a quartz plate to form a thin film of Copolymer 1. The ultraviolet/visible absorption spectrum and fluorescence spectrum of this thin film were measured on an ultraviolet/visible absorption spectrophotometer (UV3500 manufactured by Hitachi, Ltd.) and a fluorescence spectrophotometer (850 manufactured by Hitachi, Ltd.), respectively. For derivation of the fluorescence intensity, the fluorescence spectrum obtained by excitation at 350 nm was used. The area of the fluorescence spectrum obtained with the abscissa representing wavenumbers was divided by the absorbance at 350 nm to derive the relative fluorescence intensity. The relative value of the fluorescence intensity was found to be 0.62.

Reference Example 5

<Synthesis of Polymeric Fluorescent Substance 2>

2,7-dibromo-9,9-dioctylfluorene (26.32 g, 0.0480 mol), 2,7-dibromo-9,9-diisopentylfluorene (5.6 g, 0.0121 mol) and 2,2'-bipyridyl (22 g, 0.141 mol) were dissolved in dehydrated tetrahydrofuran (1,600 mL), and then the air in the reaction system was replaced with nitrogen by nitrogen bubbling. Under a nitrogen atmosphere, this solution was mixed with bis(1,5-cyclooctadiene)nickel(0) (Ni(COD)$_2$) (40.01 g, 0.145 mol), heated to 60° C. and allowed to react for 8 hours. After termination of the reaction, the reaction solution was cooled to room temperature (about 25° C.) and dropped into a mixed solution composed of 25% aqueous dropped into methanol (3,300 mL) and stirred for 30 minutes. The precipitate separated out was filtered, washed with methanol (1,000 mL) and then dried under reduced pressure for 5 hours. The yield of Polymeric Fluorescent substance 2 obtained was 20.47 g. The number and weight average molecular weights of Polymeric Fluorescent Substance 2, in terms of polystyrene, were $6.0 \times 10^4$ and $1.5 \times 10^5$, respectively.

Example 8

On a glass substrate with a 150 nm thick ITO film deposited by the sputtering method, a 50 nm thick film was formed by spin coating using a solution of poly(ethylene dioxythiophene)/polystyrene sulfonic acid (Baytron P®, Bayer Co.) and dried at 120° C. for 10 minutes on a hot plate. Then, a film was formed by spin coating at a revolution rate of 1,500 rpm using a toluene solution of a mixture composed of Copolymer 6and Polymer 4, both obtained above, prepared to have a mixture concentration of 1.5 wt %. In this case, the mixing ratio of Copolymer 6 was 30 wt %. The laminated article was further dried under reduced pressure at 80° C. for 1 hour to form the cathode buffer layer, on which the cathode, calcium was deposited in a thickness of about 20 nm and then aluminum was deposited in a thickness of about 50 nm, thus yielding an EL device. It should be noted that the metal deposition was started after the degree of vacuum reached $1 \times 10^{-4}$ Pa or below. Application of voltage to the thus obtained EL device yielded the EL emission from the device with a peak at 552 nm. The intensity of the EL emission was approximately proportional to the current density. The above described device exhibited a luminance exceeding about 1 cd/m$^2$ at about 4.4 V. and a maximum efficiency of 0.34 cd/A.

INDUSTRIAL APPLICABILITY

The present invention can provide a novel EL device which uses a copolymer comprising 9-oxo-9-phosphafluorene-2,7-diyl units in the main chain thereof. The above described EL device can be preferably used for a curved plane or a flat light source for a back light of a liquid crystal display and for illumination, and for devices including a segment type display and a dot matrix flat panel display.

The invention claimed is:

1. An electroluminescent device comprising electrodes consisting of a pair of an anode and a cathode, at least one of the electrodes being either transparent or translucent, and an organic layer interposed between said electrodes, wherein said organic layer comprises a copolymer comprising in the main chain thereof 9-oxo-9-phosphafluorene-2,7-diyl units and arylene units represented by formula (1) below, and the thickness of said organic layer is from 1 nm to 10 μm:

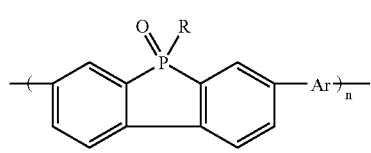

wherein R represents hydrogen, alkyl, cycloalkyl, aralkyl, aryl, alkyloxy, cycloalkyloxy, aralkyloxy, or aryloxy; Ar represents arylene; and n is an integer of 3 to 30,000.

2. An electroluminescent device comprising electrodes consisting of a pair of an anode and a cathode, at least one of the electrodes being either transparent or translucent, and an organic layer interposed between said electrodes, wherein said organic layer comprises a copolymer having a number average molecular weight of $10^3$ to $10^8$ in terms of polystyrene and having in the main chain thereof repeating units represented by the following formulas (2) and (3), respectively:

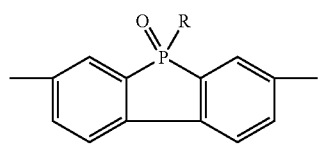

wherein R represents hydrogen, alkyl, cycloalkyl, aralkyl, aryl, alkyloxy, cycloalkyloxy, aralkyloxy, or aryloxy; and

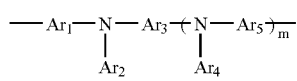

wherein $Ar_1$, $Ar_3$ and $Ar_5$ are each independently arylene or a divalent heterocyclic group; $Ar_2$ and $Ar_4$ are each independently aryl or a monovalent heterocyclic group; and m is an integer of 0 to 3.

3. The electroluminescent device according to claim 2, wherein in said copolymer, the combined molar amount of the repeating units represented by formulas (2) and (3) is 50% or more based on the total molar amount of all the repeating units of said copolymer, and the molar amount of the repeating unit represented by formula (2) is from 10 to 90% based on the combined molar amount of the repeating units represented by formulas (2) and (3).

4. The electroluminescent device according to claim 2 or 3, wherein said organic layer comprises a polymer composition comprising said copolymer and a polymer having a number average molecular weight of $10^3$ to $10^8$ in terms of polystyrene and capable of emitting fluorescence in a solid state.

5. The electroluminescent device according to claim 1, wherein said organic layer is a light emitting layer.

6. The electroluminescent device according to claim 1, wherein said organic layer further comprises a hole transport material.

7. The electroluminescent device according to claim 1, wherein said organic layer further comprises an electron transport material.

8. The electroluminescent device according to claim 1, wherein said organic layer further comprises a light emitting material.

9. The electroluminescent device according to claim 1, wherein said organic layer further comprises a light emitting material, a hole transport material, and/or an electron transport material.

10. The electroluminescent device according to claim 1, comprising a layer comprising a conductive polymer arranged between at least one of said electrodes and said organic layer and adjacent to said electrode.

11. The electroluminescent device according to claim 1, comprising an electron transport layer arranged between said cathode and said organic layer and adjacent to said organic layer.

12. The electroluminescent device according to claim 1, comprising a hole transport layer arranged between said anode and said organic layer and adjacent to said organic layer.

13. The electroluminescent device according to claim 1, comprising an electron transport layer arranged between said cathode and said organic layer and adjacent to said organic layer; and a hole transport layer arranged between said anode and said organic layer and adjacent to said organic layer.

14. The electroluminescent device according to claim 4, wherein said organic layer is an electron transport layer or a hole transport layer and a light emitting layer is provided adjacent to said organic layer.

15. A flat light source comprising an electroluminescent device according to claim 1.

16. A segment display comprising an electroluminescent device according to claim 1.

17. A dot matrix display comprising an electroluminescent device according to claim 1.

18. A liquid crystal display comprising a back light formed of an electroluminescent device according to claim 1.

19. A copolymer having a number average molecular weight of $10^3$ to $10^8$ in terms of polystyrene and comprising in the main chain thereof repeating units represented by the following formulas (2) and (3), respectively:

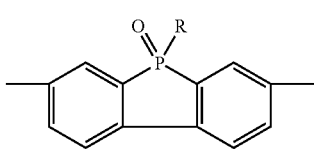

wherein R represents hydrogen, alkyl, cycloalkyl, aralkyl, aryl, alkyloxy, cycloalkyloxy, aralkyloxy, or aryloxy; and

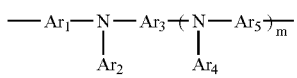

wherein $Ar_1$, $Ar_3$ and $Ar_5$ are each independently arylene or a divalent heterocyclic group; $Ar_2$ and $Ar_4$ are each independently aryl or a monovalent heterocyclic group; and m is an integer of 0 to 3.

20. The copolymer according to claim 19, wherein the combined molar amount of the repeating units represented by formulas (2) and (3) is 50% or more based on the total molar amount of all the repeating units of said polymer, and the molar amount of the repeating unit represented by formula (2) is from 10 to 90% based on the combined molar amount based on the repeating units represented by formulas (2) and (3).

21. A polymer composition, comprising the copolymer according to claim 19 or 20 and a polymer having a number average molecular weight of $10^3$ to $10^8$ in terms of polystyrene and capable of emitting fluorescence in a solid state.

* * * * *